(12) United States Patent
Wu et al.

(10) Patent No.: US 8,259,425 B2
(45) Date of Patent: Sep. 4, 2012

(54) PROTECTION CIRCUIT

(75) Inventors: Hui-Mou Wu, Taipei Hsien (TW); Kuo-Lun Tsen, Taipei Hsien (TW)

(73) Assignee: Giga-Byte Technology Co., Ltd., Taipei Hsien (TW)

( * ) Notice: Subject to any disclaimer, the term of this patent is extended or adjusted under 35 U.S.C. 154(b) by 244 days.

(21) Appl. No.: 12/555,020

(22) Filed: Sep. 8, 2009

(65) Prior Publication Data

US 2011/0058294 A1    Mar. 10, 2011

(51) Int. Cl.
*H02H 9/00*    (2006.01)
(52) U.S. Cl. ............................................. 361/57; 361/56
(58) Field of Classification Search ...... 361/56, 361/57, 91.1; 257/355
See application file for complete search history.

(56) References Cited

U.S. PATENT DOCUMENTS 5,999,386 A * 12/1999 Anderson et al. ............... 361/56
2003/0169549 A1 * 9/2003 Ziemer et al. ................ 361/91.1

* cited by examiner

*Primary Examiner* — Stephen W Jackson
*Assistant Examiner* — Angela Brooks
(74) *Attorney, Agent, or Firm* — Chun-Ming Shih

(57) ABSTRACT

A protection circuit is coupled between a chipset and an I/O port. The protection circuit comprises at least two protection devices and a control device. The protection devices are coupled in parallel with each other, and coupled between the I/O port and the chipset. The protection devices receive an input signal from the I/O port. When the I/O port has a surge current thereon, the protection devices perform a discharge operation for the surge current. The control device selects one of the protection devices to transmit the input signal t the chipset.

15 Claims, 6 Drawing Sheets

PROTECTION CIRCUIT

BACKGROUND

1. Field of the Invention

The present invention relates to a protection circuit, and more particularly to an electrostatic discharge protection circuit.

2. Description of the Related Art

With the rapid development of the semiconductor manufacturing technology, the sizes of the elements of the integrated circuits have been reduced to the sub-micron grade for improving the properties and the operation speeds of the integrated circuits. With the reduction of the sizes of the elements, some problems of the reliability thereof appear. More particularly, it will greatly influence the protection capability for the electrostatic discharge (ESD) or the lightning surge of the integrated circuits. In other words, it will greatly reduce the tolerance for the ESD of the elements.

FIG. 1 shows a conventional ESD protection device. Referring to FIG. 1, the single ESD protection device 10 is coupled between an I/O port 11 and a chipset 12. When the I/O port 11 is suffered from a surge voltage, it will generate an excessive current which is called a surge current. At this moment, for protecting the chipset 12 from being damaged by the surge current, the protection device 10 will discharge some charge. That is, a part of the current I10 is guided to a ground terminal GND by a protection current 12. A residual current I2 enters the chipset 12. However, the charge of the residual current I11 will still cause the chipset 12 to suffer the electrical overstress (EOS), such that the elements of the chipset 12 are apt to be damaged and the whole system cannot operate normally.

FIG. 2 shows another conventional ESD protection device. That of FIG. 2 is similar with that of FIG. 1, except that of FIG. 2 includes two ESD protection devices. Referring to FIG. 2, the two ESD protection devices 20a and 20b are coupled between an I/O port 21 and a chipset 22. Similarly, when the I/O port 21 is suffered from the surge voltage, the protection device 20b will discharge some charge. Thus a π-type circuit is formed, but it may not achieve a clamping voltage of the protection device 20b. In addition, although the protection devices 20a and 20b will guide parts of the currents I20a and I20b to the ground terminal GND. The charge of the residual current I21 will damage the elements of the chipset 22, and the whole system cannot operate normally.

Therefore, it needs to provide a protection circuit, which can perform the ESD operation and can further reduce the residual current in the chipset after performing the ESD operation.

BRIEF SUMMARY

A protection circuit in accordance with an exemplary embodiment of the present invention is coupled between a chipset and an I/O port. The protection circuit comprises at least two protection devices and a control device. The protection devices are coupled in parallel with each other, and coupled between the I/O port and the chipset. The protection devices receive an input signal from the I/O port. When the I/O port has a surge current, the protection devices perform a discharge operation for the surge current. The control device selects one of the protection devices to transmit the input signal to the chipset.

In an exemplary embodiment of the present invention, the control device detects whether the chipset receives the input signal, and selects one of the protection devices to transmit the input signal to the chipset according to the detecting result.

In another exemplary embodiment of the present invention, when the control device selects one of the protection devices and detects the chipset does not receive the input signal, the control device selects another of the protection devices to transmit the input signal to the chipset.

BRIEF DESCRIPTION OF THE DRAWINGS

These and other features and advantages of the various embodiments disclosed herein will be better understood with respect to the following description and drawings, in which like numbers refer to like parts throughout, and in which.

DETAILED DESCRIPTION

Reference will now be made to the drawings to describe exemplary embodiments of the present protection circuit, in detail. The following description is given by way of example, and not limitation.

Figure 1:
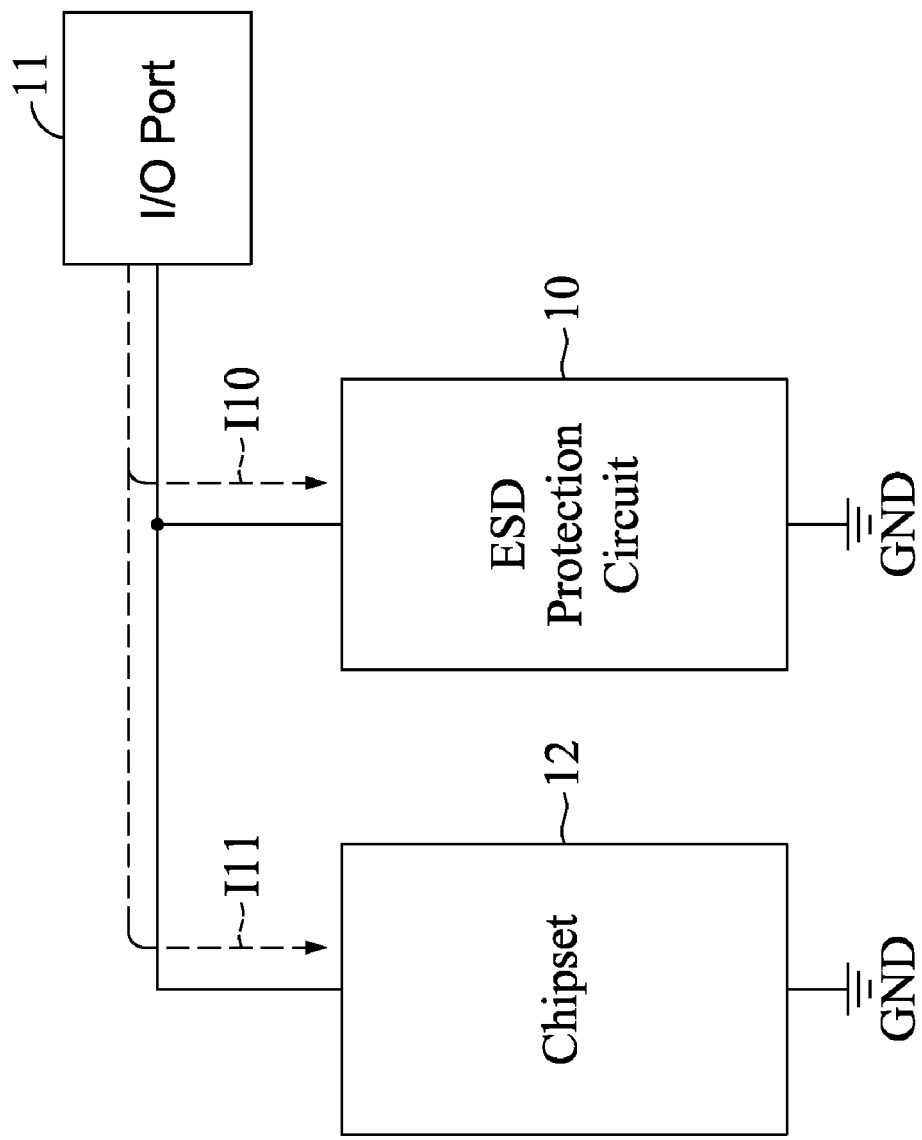
FIG. 1 shows a conventional ESD protection device.
Figure 2:
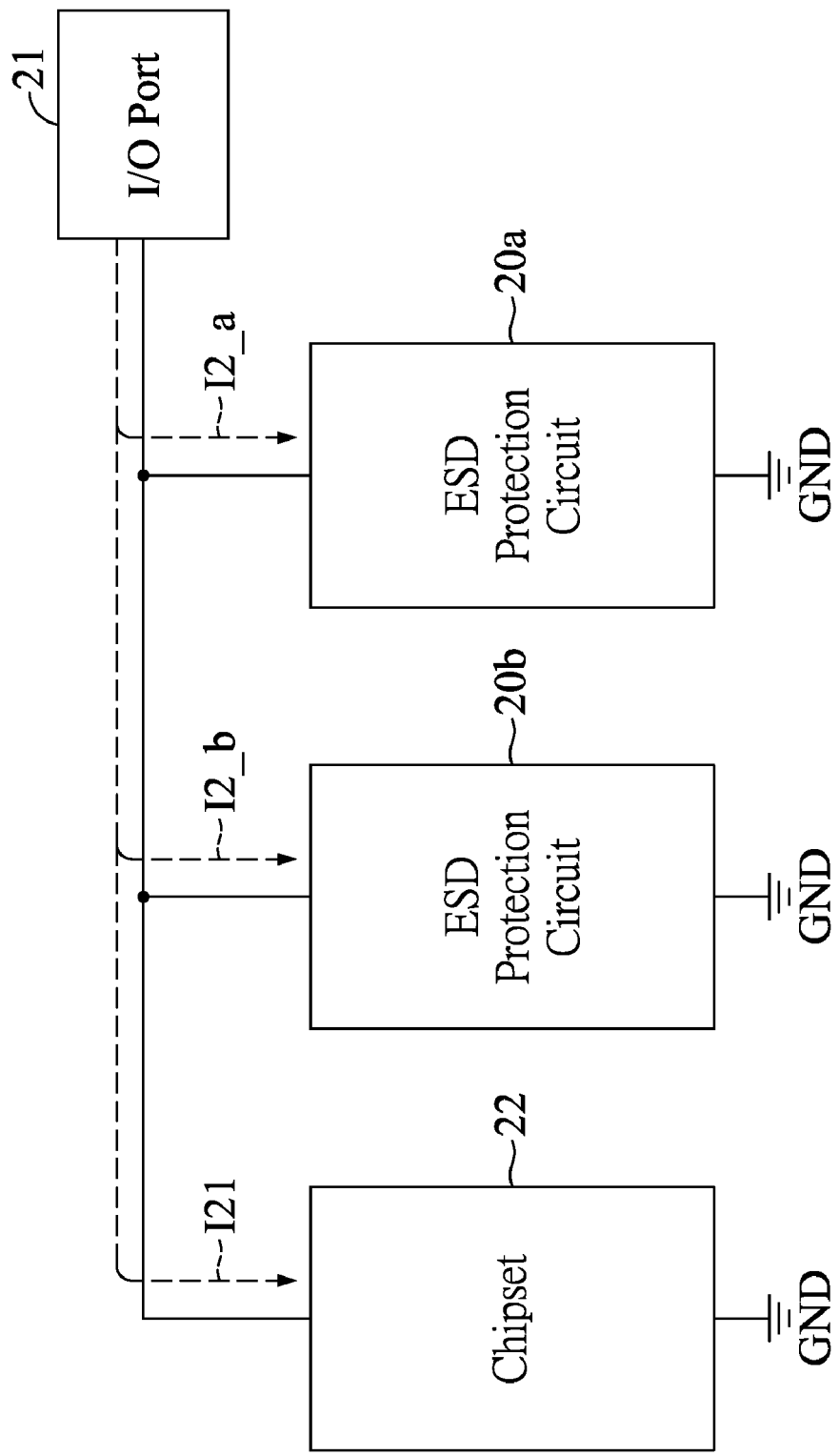
FIG. 2 shows another conventional ESD protection device.
Figure 3A:
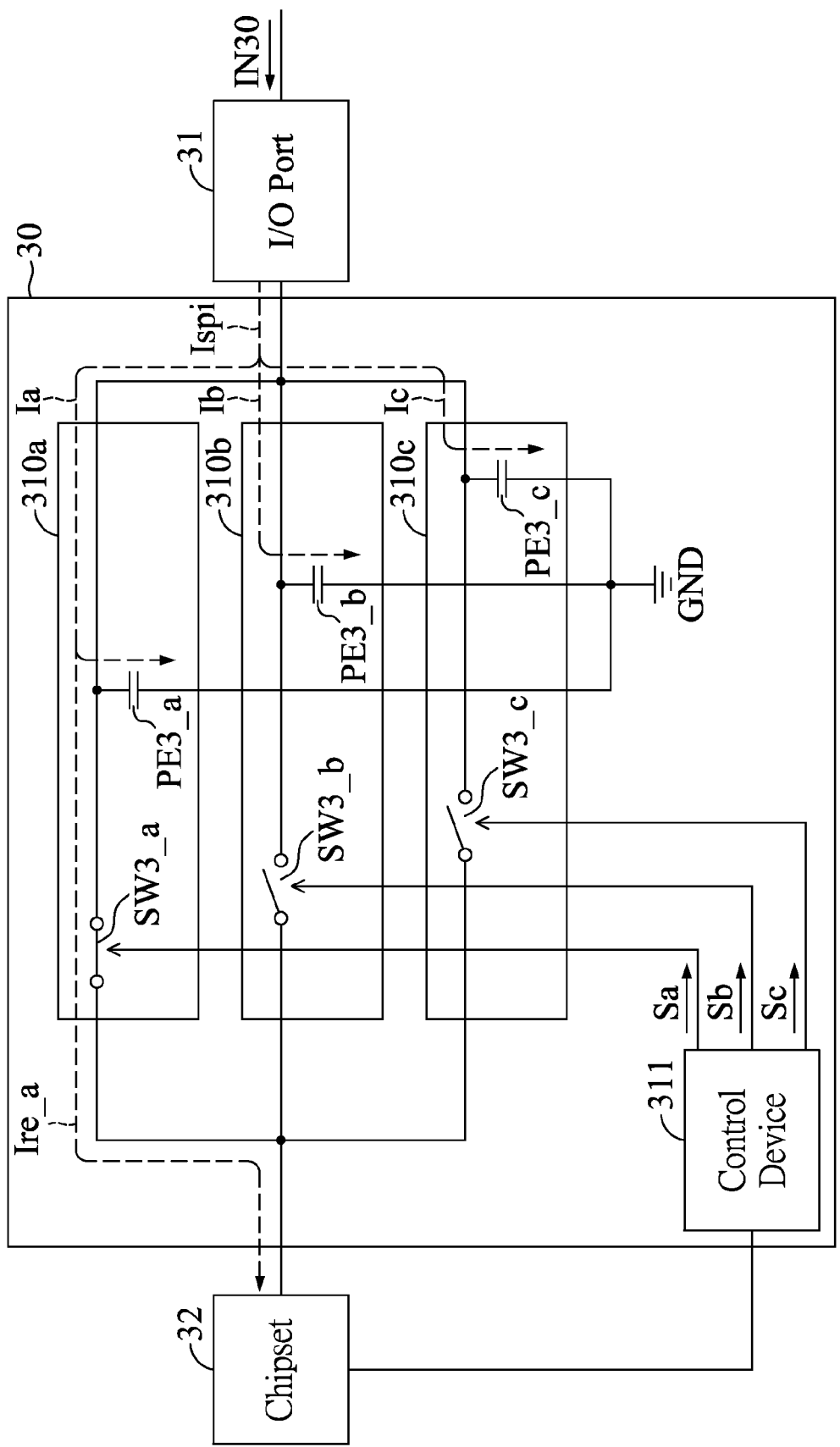
FIGS. 3a and 3b show an ESD protection circuits in accordance with an exemplary embodiment of the present invention.

FIG. 3a shows a protection circuit in accordance with an exemplary embodiment of the present invention. Referring to FIG. 3a, the protection circuit 30 is coupled between an I/O port 31 and a chipset 32. The I/O port 31 is configured for receiving an input signal IN30. The protection circuit 30 includes at least two protection devices 310 and a control device 311. This exemplary embodiment employs three protection devices 310a-310c as an example for describing the present invention. In actual application, the amount of the protection devices is determined by the system need. The protection devices 310a-310c are coupled in parallel with each other and coupled between the I/O port 31 and the chipset 32. Each of the protection devices 310a-310c receives the input signal IN30 from the I/O port 31. When the I/O port 31 is suffered from a surge voltage to generate a surge current, the protection devices 310a-310c perform a discharging operation respectively to discharge some charge to a ground terminal GND. The control device 311 generates control signals Sa, Sb and Sc to the protection devices 310a-310c respectively, for selecting one of the protection devices 310a-310c to transmit the input signal IN30 to the chipset 32. Therefore, when the I/O port 31 is suffered from the surge voltage to generate the surge current, the protection devices 310a-310c coupled in parallel can divide the surge voltage into three little currents, such that a residual current which is transmitted to the chipset 32 through one of the protection devices 310a-310c, can be reduced. The detailed circuit and description will be described in following.

Referring to FIG. 3a, each of the protection devices 310a-310c includes a protection element PE3 and a switch element SE3. In detail, the protection device 310a includes a protection element PE3_a and a switch element SW3_a; the protection device 310b includes a protection element PE3_b and a switch element SW3_b; and the protection device 310c includes a protection element PE3_c and a switch element SW3_c. In this exemplary embodiment, the protection elements PE3_a-PE3_c may be a capacitor, a diode or a transistor. The following will employ the protection device 310a as an example to describe the present invention, and the protection devices 310b and 310c are same with the protection device 310a. As shown in FIG. 3a, the protection element PE3_a is coupled between the I/O port 31 and the chipset 32. The switch element SW3_a is coupled between the I/O port 31 and the chipset 32, and is controlled by the control signal Sa.

Assuming that the control device 311 selects the protection device 310a to transmit the input signal IN30 to the chipset 32, at this moment, the switch element SW3_a of the protection device 310a is turned on according to the control signal Sa of the control device 311, and the switch elements SW3_b and SW3_c of the protection device 310b and 310c are turned off according to the control signals Sb and Sc. Therefore, the input signal IN30 from the I/O port 31 is transmitted to the chipset 32 through the protection device 310a. When the I/O port 31 is suffered from the surge voltage to generate the surge current Ispi, the surge current Ispi is divided into three little current Ia, Ib and Ic to flow into the protection devices 310a-310c respectively. The protection elements PE3_a-PE3_c of the protection devices 310a-310c perform the discharge operation respectively to discharge the charge of the current Ia, Ib and Ic. Since the surge current Ispi has been divided into the three currents Ia, Ib and Ic by the protection devices 310a-310c coupled in parallel, therefore, even if the protection element PE3_a of the protection device 310a cannot discharge completely the charge of the current Ia to generate a residual current Ire_a, the residual current Ire_a is reduced correspondingly and it will reduce the probability of damaging the chipset 32.

Figure 3B:
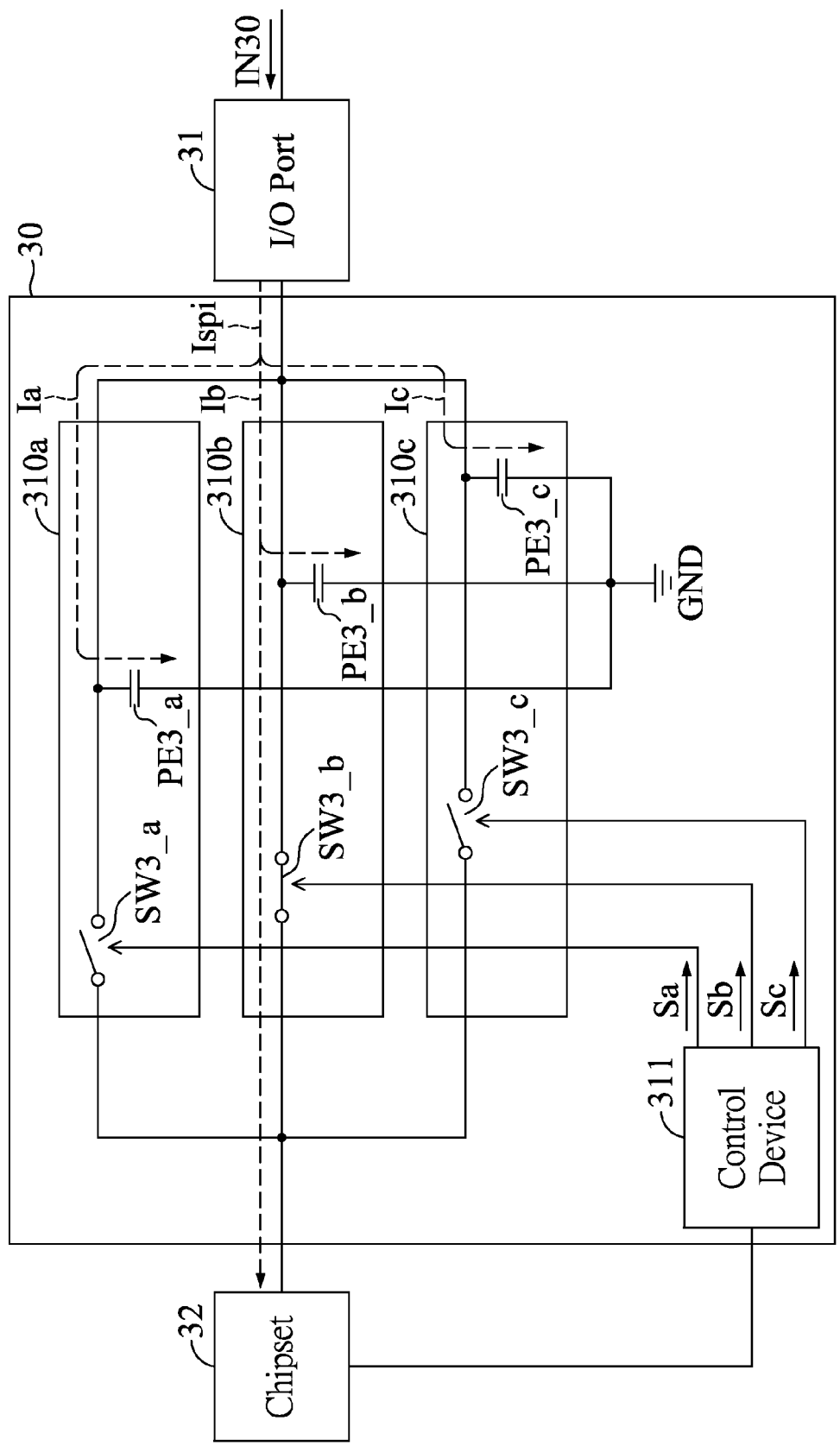

Simultaneously, the control device 311 can detect whether the chipset 32 receives the input signal IN30 from the protection device 310a. If the control device 311 detects the chipset 32 does not receive the input signal IN30, it represents that the switch element SW3_a of the protection device 310a is damaged by the residual current Ire_a. The control device 311 selects another protection device, such as the protection device 310b, to transmit the input signal IN30 to the chipset 32 according to the detecting result. Referring to FIG. 3b, at this moment, the switch element SW3_b of the protection device 310b is turned on according to the control signal Sb of the control device 311, and the switch elements SW3_a and SW3_c of the protection devices 310a and 310c is turned off according to the control signals Sa and Sc.

In the above exemplary embodiment, the switch elements SW3_a, SW3_b and SW3_c of the protection devices 310a-310c have a same standard.

In other exemplary embodiments, one of the switch elements, such as the switch element SW3_b, may be designed to have a lower standard. The control device 311 can select the protection device 310b in advance to transmit the input signal IN30 to the chipset 32. When the I/O port 31 is suffered from the surge voltage to generate the surge current Ispi, the switch element SW3_b of the protection device 310b is damaged by the residual current to protect the chipset 32 from being damaged by the surge current Ispi. At this moment, the control device 311 detects the chipset 32 does not receive the input signal IN30 and selects the protection circuit having the switch elements SW3_a and SW3_c with the higher standard to transmit the input signal IN30 to the chipset 32.

Figure 4A:
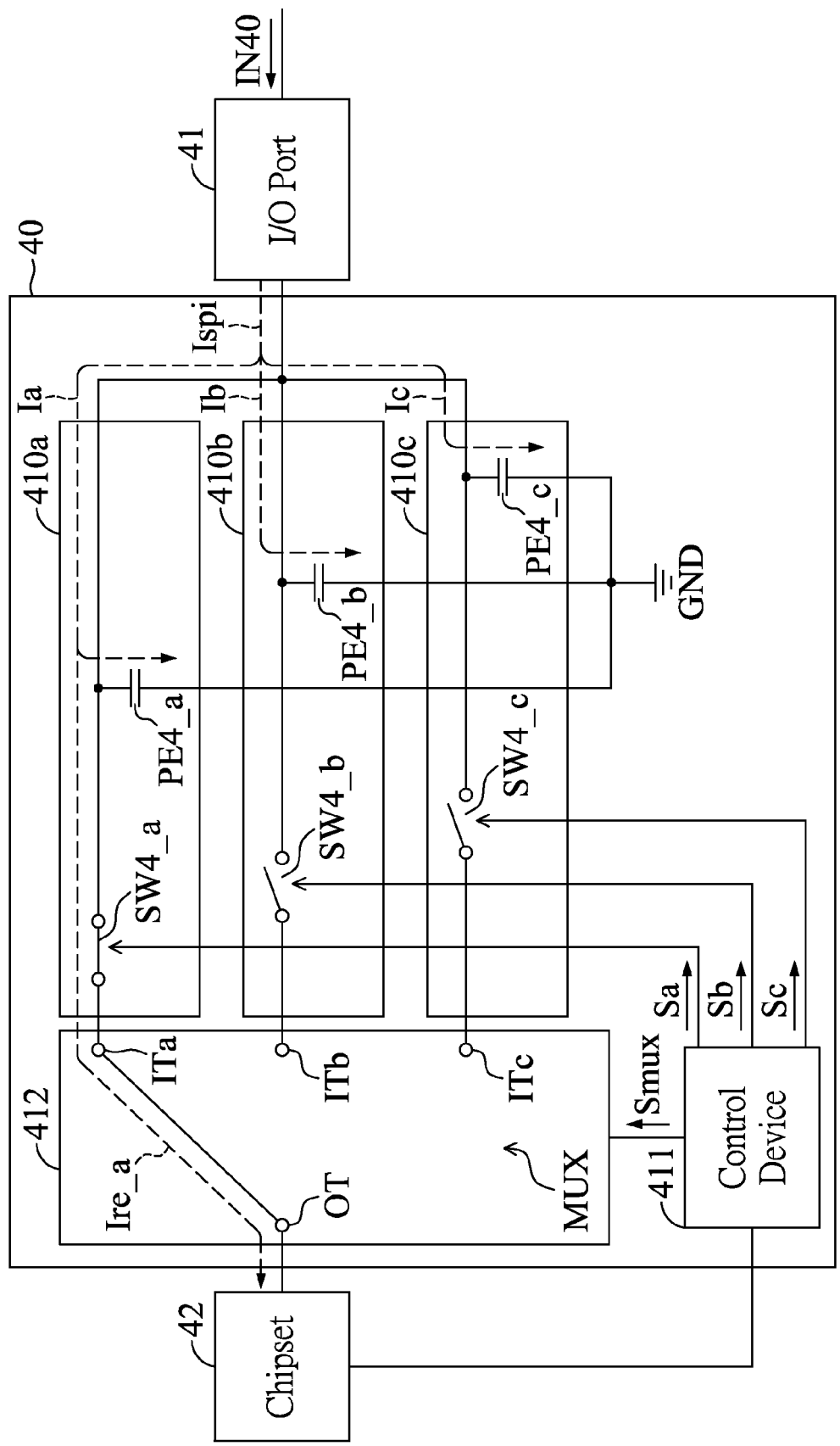
FIGS. 4a and 4b show another ESD protection devices in accordance with another exemplary embodiment of the present invention.
Figure 4B:
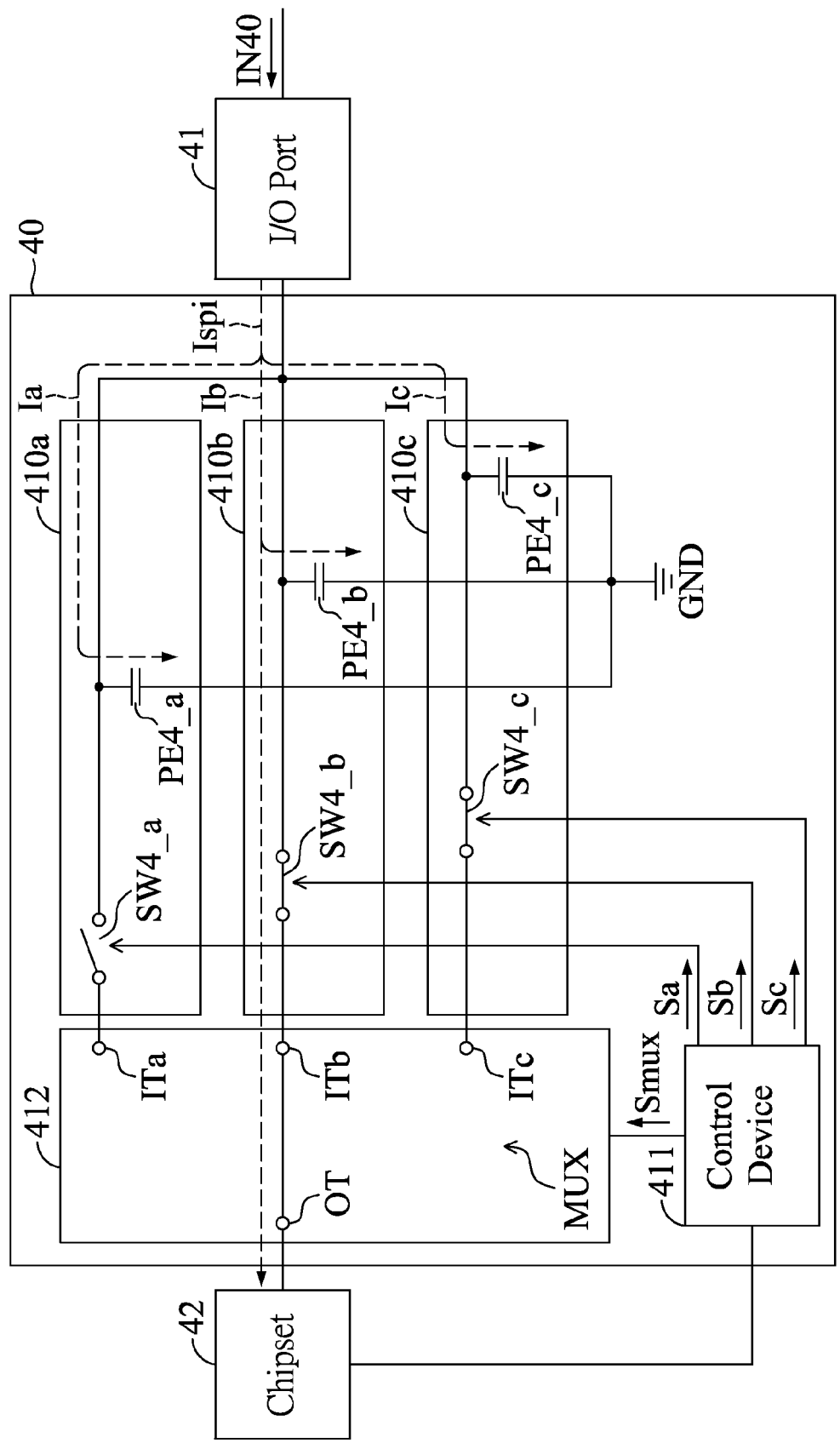

FIG. 4a shows another protection circuit in accordance with another exemplary embodiment of the present invention. Referring to FIG. 4a, the protection circuit 40 is coupled between an I/O port 41 and a chipset 42. The I/O port 41 is configured for receiving an input signal IN40. The protection circuit 40 includes at least two protection devices 410, a control device 411 and a switch device 412. This exemplary embodiment employs three protection devices 410a-410c as an example to describe the present invention. In actual application, the amount of the protection devices 410 is determined by the system need. The protection devices 410a-410c are coupled in parallel with each other and coupled between the I/O port 41 and the switch device 412. Each of the protection devices 410a-410c receives the input signal IN40 from the I/O port 41. When the I/O port 41 is suffered from a surge voltage to generate a surge current, the protection devices 410a-410c perform a discharge operation respectively to discharge some charge to a ground terminal GND. The control device 411 generates control signals Sa, Sb and Sc to the protection devices 410a-410c respectively, for selecting one of the protection devices 410a-410c to transmit the input signal IN40 to the chipset 42 through the switch device 412. Therefore, when the I/O port 41 is suffered from the surge voltage to generate the surge current, the surge current is divided into three little currents by the protection devices 410a-410c coupled in parallel to reduce a residual current which is transmitted to the chipset 42 through one of the protection devices 410a-410c. The detailed circuit and description will be described in following.

Referring to FIG. 4a, each of the protection devices 410a-410c includes a protection element PE4 and a switch element SE4. In detail, the protection device 410a includes a protection element PE4_a and a switch element SW4_a; the protection device 410b includes a protection element PE4_b and a switch element SW4_b; and the protection device 410c includes a protection element PE4_c and a switch element SW4_c. In this exemplary embodiment, the protection devices PE4_a-PE4_c may be a capacitor, a diode, or a transistor. The following will employ the protection device 410a as an example to describe the present invention, and the protection devices 410b and 410c are same with the protection device 410a. As shown in FIG. 4a, the protection element PE4_a is coupled between the I/O port 41 and the ground terminal GND. The switch element SW4_a is coupled between the I/O port 41 and the switch device 412, and is controlled by the control signal Sa.

Referring to FIG. 4a, the switch device 412 includes a multiplexer MUX. The multiplexer MUX includes three input terminals ITa, ITb and ITc to be coupled to the switch elements SW4_a-SW4_c of the protection devices 410a-410c respectively. The multiplexer MUX further includes an output terminal OT to be coupled to the chipset 42.

Assuming that the control device 411 selects the protection device 410a to transmit the input signal IN40 to the chipset 42, at this moment, the switch element SW4_a of the protection device 410a is turned on according to the control signal Sa from the control device 411, and the switch elements SW4_b and SW4_c of the protection devices 410b and 410c are turned off according to the control signals Sb and Sc. At this moment, the multiplexer MUX of the switch device 412 receives the input signal IN40 from the protection device 410a through the corresponding input terminal ITa according to the control signal Smux from the control device 411. Therefore, the input signal IN40 from the I/O port 41 is transmitted to the chipset 42 through the protection device 410a and the multiplexer MUX. When the I/O port 41 is suffered from the surge voltage to generate the surge current Ispi, the surge current Ispi is divided into three little currents Ia, Ib and Ic to flow into the protection devices 410a-410c respectively. The protection elements PE4_a-PE4_c of the protection devices 410a-410c perform the discharge operation to discharge the charge of the currents Ia, Ib and Ic respectively. Since the surge current Ispi has been divided into the three little currents Ia, Ib and Ic by the protection devices 410a-410c, therefore, even if the protection element PE4_a of the protection device 410a cannot discharge completely the charge of the current Ia to generate a residual current Ire_a, the residual current Ire_a is reduced correspondingly and the probability of damaging the chipset 42 is reduced.

Simultaneously, the control device 411 can detect whether the chipset 42 receives the input signal IN40 from the protection device 410a. If the control device 411 detects the chipset 42 does not receive the input signal IN40, it represents the switch element SW4_a of the protection device 410a is damaged by the residual current Ire_a. The control device 411 selects another protection device, such as the protection device 410b, to transmit the input signal IN40 to the chipset 42 according to the detecting result. At this moment, the switch element SW4_b of the protection device 410b is turned on according to the control signal Sb from the control device 311, and the switch elements SW4_a and SW4_c of the protection devices 410a and 410c are turned off according to the control signal Sa and Sc. The multiplexer MUX of the switch device 412 receives the input signal IN40 from the protection device 410b through the corresponding input terminal ITb according to the control signal Smux from the control device 411. Therefore, the input signal IN40 of the I/O port 41 is transmitted to the chipset 42 through the protection device 410b and the multiplexer MUX.

From the above exemplary embodiments of the present invention it can be seen that, when the I/O part is suffered from the surge current, the surge current is divided into the plurality of little currents by the plurality of protection devices coupled in parallel. Therefore, the present invention can reduce the residual current, and reduce the probability of damaging the chipset. In addition, the protection devices may be used as guard locks. When one of the protection devices is damaged by the residual current and cannot transmit the input signal, the control device can select the undamaged protection device to transmit the input signal to the chipset, such that the system can operate normally.

The above description is given by way of example, and not limitation. Given the above disclosure, one skilled in the art could devise variations that are within the scope and spirit of the invention disclosed herein, including configurations ways of the recessed portions and materials and/or designs of the attaching structures. Further, the various features of the embodiments disclosed herein can be used alone, or in varying combinations with each other and are not intended to be limited to the specific combination described herein. Thus, the scope of the claims is not to be limited by the illustrated embodiments.

What is claimed is:

1. A protection circuit coupled between a chipset and an I/O port, comprising:
    at least two protection devices coupled in parallel with each other and coupled between the I/O port and the chipset, wherein the protection devices receive an input signal from the I/O port and perform a discharge operation for a surge current when the I/O port has the surge current thereon; and
    a control device configured for selecting one of the protection devices to transmit the input signal to the chipset; and
    a multiplexer having at least two input terminals coupled to each of the protection devices respectively and an output terminal coupled to the chipset;
    wherein, when the control device selects one of the protection devices, the control device controls the multiplexer to receive the input signal and to transmit the input signal from the selected protection device to the chipset.

2. The protection circuit as claimed in claim 1, wherein the control device detects whether the chipset receives the input signal, and selects one of the protection devices to transmit the input signal to the chipset according to the detecting result.

3. The protection circuit as claimed in claim 2, wherein when the control device selects one of the protection devices and detects the chipset does not receive the input signal, the control device selects another of the protection devices to transmit the input signal to the chipset.

4. The protection circuit as claimed in claim 1, wherein each of the protection devices comprises:
    a protection element coupled between the I/O port and a ground terminal; and
    a switch element coupled between the I/O port and the chipset and controlled by a control signal.

5. The protection circuit as claimed in claim 4, wherein the control device detects whether the chipset receives the input signal, and generates the control signal to selectively turn on the switch element of one of the protection devices according to the detecting result.

6. The protection circuit as claimed in claim 4, wherein the protection element is a capacitor, a diode or a transistor.

7. The protection circuit as claimed in claim 4, wherein the switch element of one of the protection devices has a standard lower than that of the switch element of any of other protection devices.

8. The protection circuit as claimed in claim 7, wherein the control device selects the protection device having the switch element with the lower standard to transmit the input signal to the chipset in advance.

9. The protection circuit as claimed in claim 8, wherein when the control device selects the protection device having the switch element with the lower standard and detects the chipset does not receive the input signal, the control device selects another protection device to transmit the input signal to the chipset.

10. The protection circuit as claimed in claim 1, wherein the control device detects whether the chipset receives the input signal and selects one of the protection devices to transmit the input signal to the chipset through the multiplexer according to the detecting result.

11. The protection circuit as claimed in claim 10, wherein when the control device selects one of the protection devices and detects the chipset does not receive the input signal, the control device selects another protection device to transmit the input signal to the chipset through the multiplexer.

12. The protection circuit as claimed in claim 1, wherein each of the protection devices comprises:
    a protection element coupled between the I/O port and a ground terminal; and
    a switch element coupled between the I/O port and the multiplexer, and controlled by a control signal.

13. The protection circuit as claimed in claim 12, wherein the control device detects whether the chipset receives the input signal, and generates the control signals to selectively turn on the switch element of one of the protection devices for transmitting the input signal to the chipset through the multiplexer.

14. The protection circuit as claimed in claim 12, wherein the protection element is a capacitor, a diode, or a transistor.

15. The protection circuit as claimed in claim 1, wherein when the control device selects one of the protection devices, the control device controls the multiplexer to receive the input signal from the selected protection device through a corresponding one of the input terminals.

\* \* \* \* \*